United States Patent
Jeong et al.

(10) Patent No.: US 9,062,968 B2
(45) Date of Patent: Jun. 23, 2015

(54) PCB LOADING APPARATUS FOR MEASURING THICKNESS OF PRINTED CIRCUIT BOARD STACK

(71) Applicant: Avago Technologies General IP (Singapore) Pte. Ltd., Singapore (SG)

(72) Inventors: Jin Jeong, Kyunggi province (KR); Chris Chung, Seoul (KR); Tae Eun Kim, Gyeonggi-do (KR)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 57 days.

(21) Appl. No.: 13/948,531

(22) Filed: Jul. 23, 2013

(65) Prior Publication Data

US 2015/0027240 A1    Jan. 29, 2015

(51) Int. Cl.
*G01B 7/16* (2006.01)
*G01B 21/08* (2006.01)
*G01B 7/06* (2006.01)

(52) U.S. Cl.
CPC . *G01B 21/08* (2013.01); *G01B 7/06* (2013.01)

(58) Field of Classification Search
CPC .................................. G01B 21/08; G01B 7/06
USPC ........................................... 73/760, 763, 818
See application file for complete search history.

(56) References Cited

U.S. PATENT DOCUMENTS

| | | | | |
|---|---|---|---|---|
| 4,194,113 A | * | 3/1980 | Fulks et al. | 714/732 |
| 4,538,104 A | * | 8/1985 | Douglas et al. | 324/750.2 |
| 5,087,878 A | * | 2/1992 | Belmore et al. | 324/750.22 |
| 5,285,149 A | * | 2/1994 | Galdik et al. | 324/755.11 |
| 6,900,648 B2 | * | 5/2005 | Ou et al. | 324/750.25 |
| 7,611,899 B2 | * | 11/2009 | Whitson et al. | 436/45 |
| 8,248,822 B2 | | 8/2012 | Lu et al. | |
| 8,403,619 B2 | | 3/2013 | Moura et al. | |
| 2007/0018300 A1 | * | 1/2007 | Ryu et al. | 257/686 |
| 2007/0152694 A1 | * | 7/2007 | Yin et al. | 324/765 |
| 2009/0194851 A1 | | 8/2009 | Chiu et al. | |

OTHER PUBLICATIONS

Wynces Silvoza et al., "Design, Manufacturing, and Handling Guidelines for Cypress Wafer Level Chip Scale Packages", Cypress Perform, Document No. 001-69061 Rev. *B, www.cypress.com, pp. 1-21.

* cited by examiner

*Primary Examiner* — Max Noori (57) ABSTRACT

A loading apparatus for loading a printed circuit board (PCB) stack including one or more PCB layers and transferring the PCB stack to an inspection probe includes a movable support unit, a guide unit and a cover. The guide unit is provided on the support unit and defines a depression portion in which the PCB stack is mounted. The cover is configured to cover the depression portion of the guide unit when closed, where the cover has multiple protrusions extending from a lower surface, which press the PCB stack into the depression portion when the cover is closed.

20 Claims, 7 Drawing Sheets

PCB LOADING APPARATUS FOR MEASURING THICKNESS OF PRINTED CIRCUIT BOARD STACK

BACKGROUND

Various embodiments relate to an apparatus for loading a printed circuit board (PCB) and, more particularly, to a PCB loading apparatus which holds and transfers a PCB for measuring a thickness thereof.

To facilitate mass production of electronic devices having PCBs, it is desirable to be able to measure a priori the thicknesses of layers of the PCBs to be incorporated in the devices.

Figure 1A:
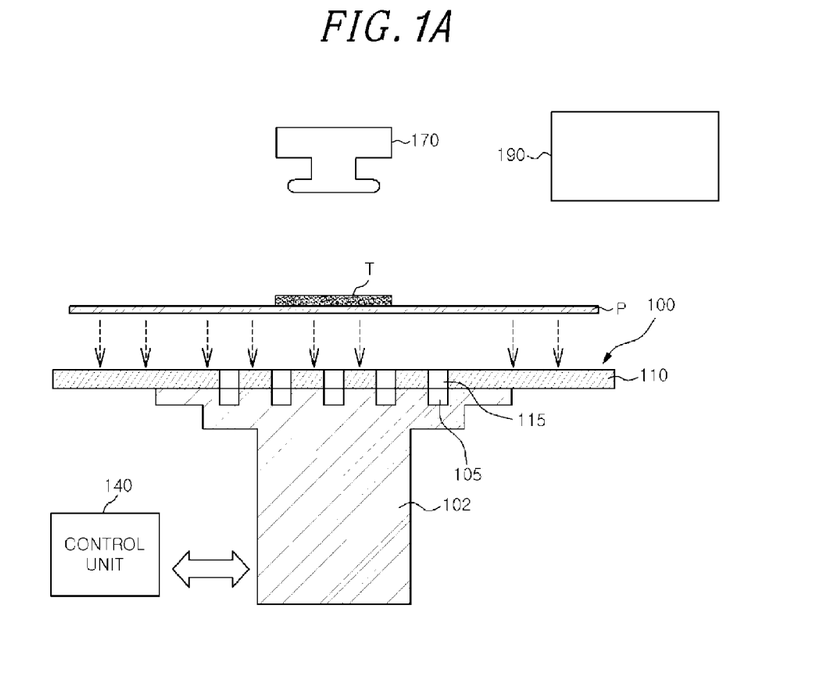
FIG. 1A is a block diagram and cross-sectional view showing a conventional PCT thickness inspection system.

FIG. 1A shows a conventional PCB inspection system for measuring thicknesses of PCB layers a PCB stack P. The conventional PCB inspection system shown in FIG. 1A includes a PCB loading apparatus 100, a control unit 140 for controlling operations of the loading apparatus 100, an image camera 170 for acquiring positions of the PCB layers to be inspected, and an inspection probe 190 for measuring the thicknesses of the PCB layers.

The PCB loading apparatus 100 includes a vacuum chuck 102, which defines vacuum holes 105 in an upper surface thereof, and a PCB holder 110, which is provided on an upper surface of the vacuum chuck 102 and defines fixing holes 115 penetrating therethrough. The vacuum chuck 102 is configured to generate a vacuum suction force. The number of fixing holes 115 penetrating through the PCB holder 110 is the same as the number of vacuum holes 105. The PCB holder 110 is placed on the vacuum chuck 102 so that the fixing holes 115 communicate with respective vacuum holes 105.

Figure 1B:
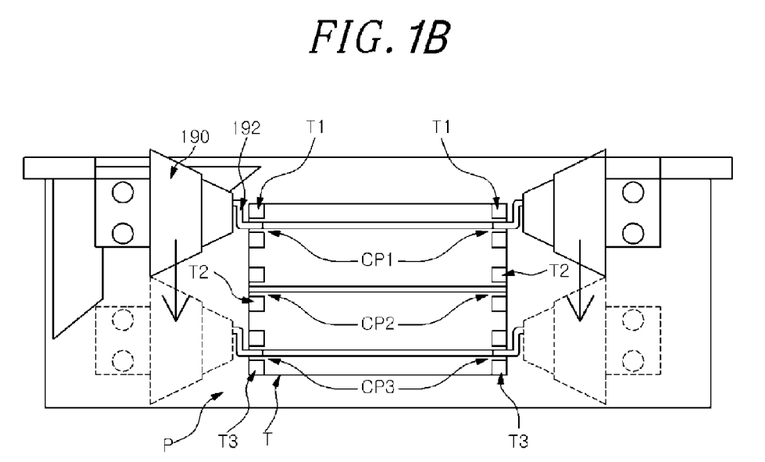
FIG. 1B is a cross-sectional view of a probe and a PCB stack of FIG. 1A in more detail.

FIG. 1B shows the inspection probe 190 and the stack of PCB layers P of FIG. 1A in more detail.

The inspection probe 190 includes a pair of probe tips 192 to be used for measuring the thicknesses of the PCB layers. The PCB stack P includes an inspection area T having pairs of inspection ports T1, T2 and T3, the number of which is the same as the number of the PCB layers. The inspection ports T1, T2 and T3 are provided with corresponding contact points CP1, CP2 and CP3, respectively, to be contacted by the probe tips 192 for measuring the PCB thicknesses. The contact points CP1, CP2 and CP3 are electrically connected to the PCB layers, respectively.

A process for measuring the thicknesses of the PCB layers using the conventional PCB inspection system will now be described with reference to FIGS. 1A and 1B. When the PCB stack P is loaded onto the PCB holder 110, a vacuum suction force generated from the vacuum chuck 102 is applied to the PCB stack P through the vacuum holes 105 and the fixing holes 115 to hold the PCB stack P on the PCB holder 110. After the loading of the PCB stack P has been completed, alignment of the PCB stack P is carried out based on both a position of the vacuum chuck 102 previously stored in the control unit 140 and a position of the PCB stack P with respect to the vacuum chuck 102 measured by the image camera 170. Based on the result of the alignment, the vacuum chuck 102 transfers the PCB stack P to the inspection probe 190. The inspection probe 190 successively brings the pair of probe tips 192 into contact with the contact points CP1, CP2 and CP3 of the inspection ports T1, T2 and T3 of the PCB stack P, thereby measuring the thicknesses of the PCB layers.

However, the conventional PCB inspection system using the PCB loading apparatus 100 has a number of drawbacks. When the PCB stacks P are loaded onto the PCB holder 110, their positions with respect to the vacuum chuck 102 may differ, e.g., depending on the operator who loads the PCB stacks P. Therefore, whenever a PCB stack P is loaded, alignment must be performed, resulting in increased inspection time.

Furthermore, the PCB stack P is held on the PCB holder 110 only by the vacuum suction force of the vacuum chuck 102. Thus, after the vacuum chuck 102 transfers the PCB stack P to the inspection probe 190, its position with respect to the vacuum chuck 102 may change from that used for the alignment. In this case, the probe tips 192 may not exactly come into contact with the contact points CP1, CP2 and CP3 of the inspection ports T1, T2 and T3, thereby compromising the reliability of the inspection process.

Accordingly, there exists a need for an apparatus capable of carrying out a PCB measurement operation in less time with enhanced reliability.

SUMMARY

In accordance with a representative embodiment, a loading apparatus is provided for loading a printed circuit board (PCB) stack including one or more PCB layers and transferring the PCB stack to an inspection probe. The loading apparatus includes a movable support unit, a guide unit and a cover. The guide unit is provided on the support unit and defines a depression portion in which the PCB stack is mounted. The cover is configured to cover the depression portion of the guide unit when closed, where the cover has multiple protrusions extending from a lower surface, which press the PCB stack into the depression portion when the cover is closed.

In accordance with another representative embodiment, a PCB inspection system is provided, including an inspection probe for measuring thicknesses of one or more PBC layers of a PCB stack, and a loading apparatus configured to load the PCB stack and to transfer the PCB stack to the inspection probe. The loading apparatus includes a movable support unit, a guide unit and a cover. The guide unit is positioned on the support unit and defines a depression portion for mounting the PCB stack therein. The cover is configured to cover the depression portion of the guide unit when closed, the cover having multiple protrusions extending from a lower surface, where the protrusions press the PCB stack into the depression portion when the cover is closed.

In accordance with another representative embodiment, a method is provided for measuring a thickness of a PCB stack comprising one or more PCB layers using an inspection probe and a loading apparatus having a movable support unit and a guide unit provided on the support unit. The method includes loading the PCB stack into a depression portion of the guide unit, closing a cover over the depression portion, causing multiple protrusions extending from a lower surface of the cover to press the PCB stack into the depression portion of the guide unit, securing the PCB stack in an initial position, moving the loading apparatus to the inspection probe, and determining a thickness of the PCB stack using the inspection probe.

BRIEF DESCRIPTION OF THE DRAWINGS

Illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Hereinafter, embodiments of the present invention will be described in detail with reference to the accompanying drawings so that they can be readily implemented by those skilled in the art. However, the described embodiments are only exemplary and not to be construed to limit the scope of the invention thereto.

Figure 2:
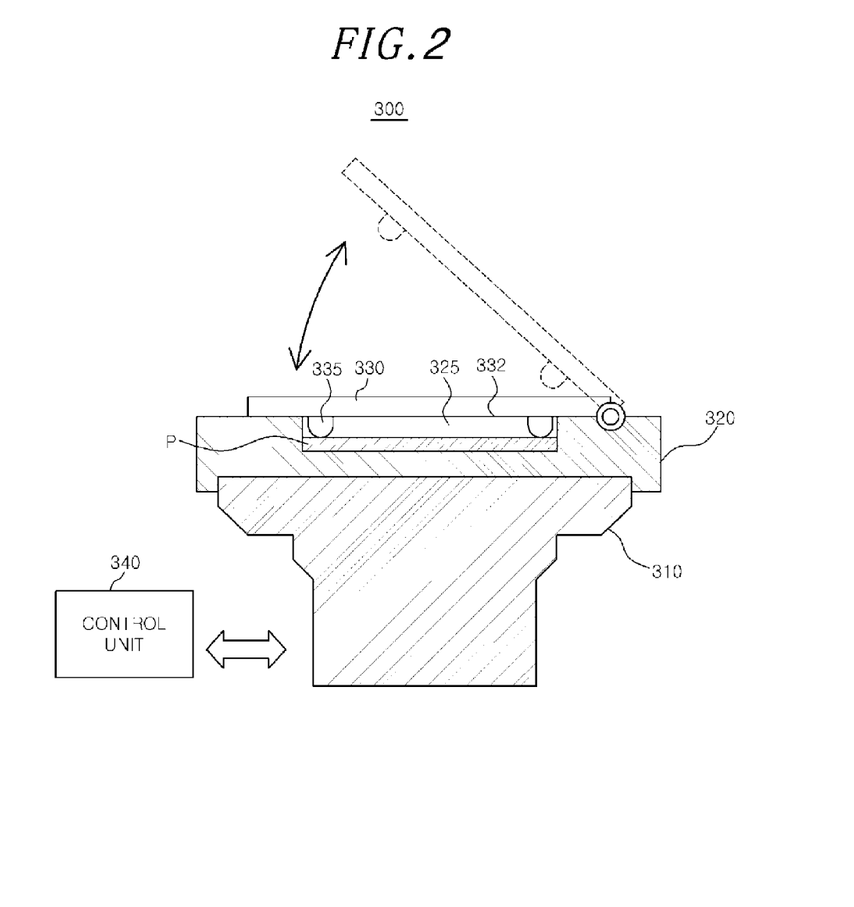
FIG. 2 is a block diagram and cross-sectional view of a loading apparatus, in accordance with a representative embodiment.

FIG. 2 is a block diagram and cross-sectional view of a loading apparatus 300, in accordance with a representative embodiment. The loading apparatus 300 includes a support unit 310 which can be moved by a motor, and a guide unit 320 which is fixed on the support unit 310. The support unit 310 defines a depression portion 325 into which a PC B stack P is loaded. The PCB stack includes one or more stacked PCB layers. The loading apparatus 300 further includes a cover 330, which is operable to cover and uncover the depression portion 325 of the guide unit 320, and a control unit 340, which stores an initial position of the loading apparatus 300 before loading the PCB stack P and controls movement of the loading apparatus 300.

The cover 330 is rotatably connected at one edge to the guide unit 320, so that the cover 330 can open or close the depression portion 325. Multiple protrusions 335 extend from a lower surface 332 of the cover 330, the lower surface facing the depression portion 325 when the cover 330 is closed over the depression portion 325. The protrusions 335 are configured to press the PCB stack P into the depression portion 325 towards the support unit 310 when the cover 330 is closed, thus preventing the PCB stack P from moving within the depression portion 325. By virtue of the structure in which the protrusions 335 press against the PCB stack P, the PCB stack P is prevented from changing position, even when the loading apparatus 300 is moving.

In the depicted embodiment, the depression portion 325 has a rectangular shape, where the sides of the rectangle are longer by about 1 mm to about 10 mm than predetermined lengths of the sides of the PCB stack P. The PCB stack P is loaded into the depression portion 325 such that the PCB stack P is brought into contact with a predetermined corner of the depression portion 325. In this way, the initial position of each of the PCB stacks loaded into the depression portion 325 is the same each time. Therefore, a separate alignment process is not required every time a PCB stack P is loaded into the depression portion 325.

Due to the shape and the lengths of the sides of the depression portion 325, the loading apparatus 300 does not require an additional alignment process other than an initial alignment process for positioning the loading apparatus 300. Therefore, time required for performing the inspection is reduced.

Figure 3:
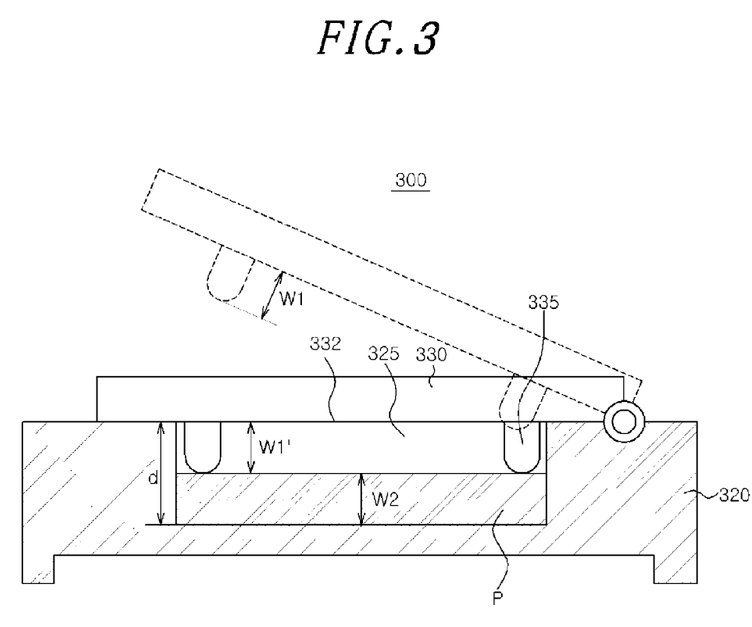
FIG. 3 is a cross-sectional view of a guide unit and a cover of the loading apparatus of FIG. 2, in accordance with a representative embodiment.

FIG. 3 is a cross-sectional view of the guide unit 320 and the cover 330 of the loading apparatus 300 of FIG. 2, in accordance with a representative embodiment.

When the cover 330 is in the closed position (indicated by solid lines), the protrusions 335 extending from the lower surface 332 of the cover 330 come into contact with an upper surface of the PCB stack P (positioned within the depression portion 325). A depth d of the depression portion 325 is less than the sum of a length w1 of the protrusions 335 extending from the lower surface 332 when the cover 330 is in the opened position and a predetermined thickness w2 of the PCB stack P. However, since the protrusions 335 are formed of an elastic material, such as rubber or elastic polymer, for example, they are compressible. Therefore, the sum of a length W1' of the protrusions 335 protruding from the lower surface 332 when the cover 330 is in the closed position and the predetermined thickness w2 of the PCB stack P becomes substantially the same as the depth d of the depression portion 325. Therefore, the initial position of the PCB stack P can be reliably maintained by the protrusions 335 which press the PCB stack P towards the support unit 310, even while the loading apparatus 300 is moving. As a result, the probability of a failure of contact between a probe tip of the inspection probe and contact points of an inspection area T of the PCB stack P is reduced. Moreover, since the protrusions 335 are made of an elastic material, the PCB stack P is prevented from being damaged when the PCB stack P is pressed by the protrusions 335.

Figure 4:
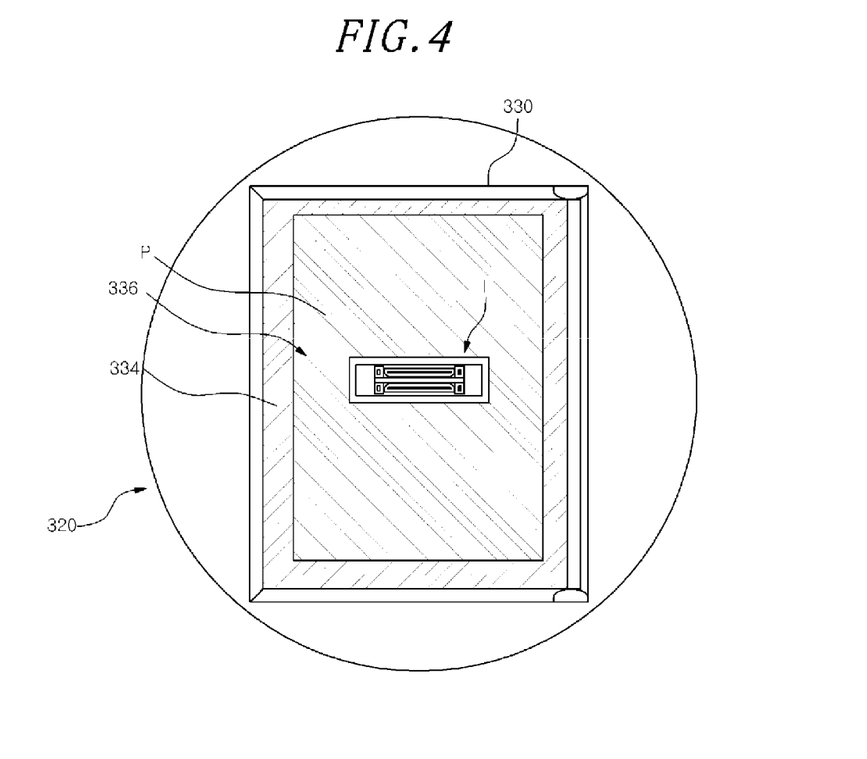
FIG. 4 is a plan view of a loading apparatus, in accordance with a representative embodiment.

FIG. 4 is a plan view of the loading apparatus, in accordance with a representative embodiment.

In the depicted embodiment, the cover 330 defines an opening 336 which exposes the inspection area T of the PCB stack P to the outside. The cover 330 also includes a perimeter part 334 that surrounds the opening 336. The protrusions 335 (not shown in FIG. 4) are located on the lower surface 332 of the perimeter part 334 of the cover 330.

The cover 330 may be made of a lightweight material, such as aluminum or gold-plated copper, for example, so that the operator who loads the PCB stack P can easily open and close the cover 330. Furthermore, in order to reduce potentially negative effects of external electromagnetic waves passing through the opening 336 after the PCB stack P is loaded into the loading apparatus 300, the protrusions 335 and/or the perimeter part 334 may be formed of materials that have the ability to absorb electromagnetic waves.

Figure 5:
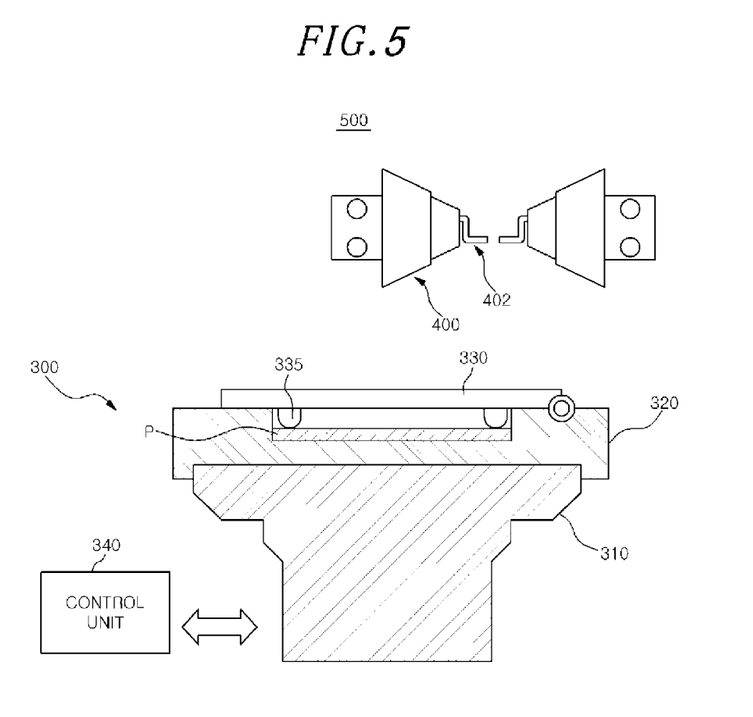
FIG. 5 is a block diagram and cross-sectional view of a PCB thickness inspection system using the loading apparatus, in accordance with a representative embodiment.

FIG. 5 is a block diagram and cross-sectional view of a PCB thickness inspection system using the loading apparatus, in accordance with a representative embodiment.

The PCB inspection system 500 includes the loading apparatus 300 of FIG. 2, and an inspection probe 400 having probe tips 402 to be successively contacted with contact points of the inspection area T (not shown in FIG. 5) of the PCB stack P in order to measure thicknesses of the PCB layers.

A process of measuring the thicknesses of the PCB layers is described below. First, the user opens the cover 330 of the loading apparatus 300 and loads the PCB stack P into the depression portion 325. Before the cover 330 is closed, the PCB stack P is positioned such that one corner thereof is brought into contact with a predetermined corner of the depression portion 325. The cover 330 is then closed, causing the protrusions 335 to press onto the PCB stack P, holding it in place within the depression portion 325 by pressing the PCB stack P into a bottom surface of the depression portion 325 (toward the guide unit 320). The control unit 340 transmits an inspection execution signal to the loading apparatus 300, which moves towards the inspection probe 400 securely holding the PCB stack P.

The probe tips 402 of the inspection probe successively contact the contact points of each PCB layer of the inspection area T of the PCB stack P, and measure input and output signals, enabling calculation of corresponding S21 values of signals passing through the respective PCB layers based on the measured input and output signals. Impedance of each PCB layer may be calculated based on the S21 values. Subsequently, the thickness of each PCB layer may be calculated based on the corresponding impedance. In this way, the thicknesses of the PCB layers and of the PCB stack P can be accurately determined, where the thickness of the PCB stack may be determined by adding the thicknesses of the PCB layers.

As stated above, since the initial position of each PCB stack loaded into the depression portion 325 can be maintained, an additional alignment need not be performed every time the PCB stack P is loaded, thus reducing the time it takes to conduct the inspection. Furthermore, the initial position of the PCB stack P is reliably maintained by the protrusions 335 which press the PCB stack P into the depression portion 325 towards the support unit 310, even while the loading apparatus 300 is moving. As a result, the probability of a failure of contact between probe tips 402 of the inspection probe 400 and contact points of an inspection area T of the PCB stack P is reduced, thus enhancing the reliability of the inspection.

Figure 6:
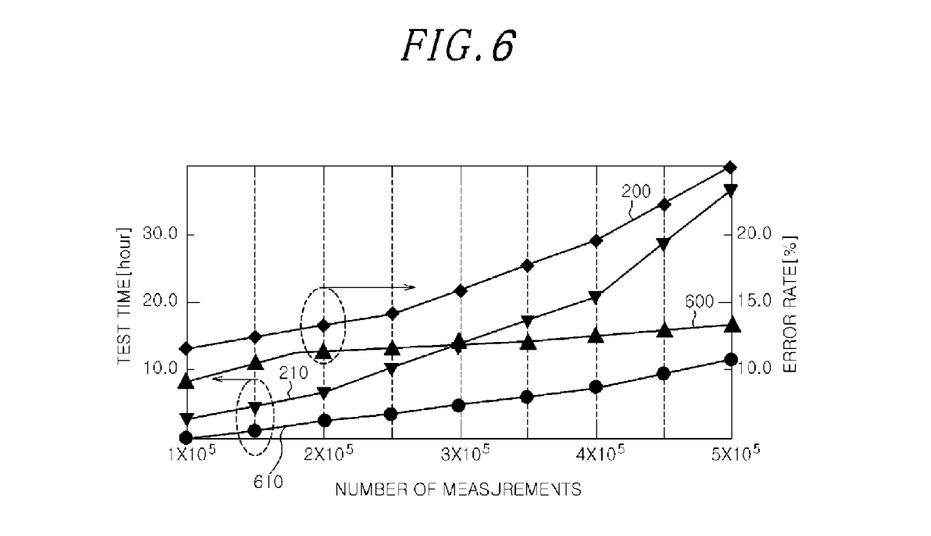
FIG. 6 is a graph for comparing performance of a PCB thickness inspection system using the loading apparatus in accordance with a representative embodiment and a conventional PCB thickness inspection system.

FIG. 6 is a graph showing performance of the PCB thickness inspection system using the loading apparatus 300, in accordance with a representative embodiment, and performance of a conventional PCB thickness inspection system.

The horizontal axis refers to the number of PCB thickness measurements, the left vertical axis refers to the time it takes to conduct each measurement, and the right vertical axis refers to an error rate of the PCB thickness measurement.

Line 200 indicates an error rate of the PCB thickness measurement performed by the conventional inspection system, and line 600 indicates an error rate of the PCB thickness measurement performed by the PCB inspection system 500 using the loading apparatus 300, in accordance with a representative embodiment. Further, line 210 indicates the time it takes to conduct the measurement using the conventional inspection system, and line 610 indicates the time it takes to conduct the measurement using the PCB inspection system 500.

Less time is needed to conduct the measurement when using the PCB inspection system 500 using the loading apparatus 300, in accordance with a representative embodiment, e.g., since an additional alignment does not have to be conducted after the initial alignment process. Further, since the PCB stack P is effectively clamped in place by the protrusions 335 of the loading apparatus 300, even when the loading apparatus 300 is moved to the inspection probe 400, the position of the PCB stack P can be prevented from being changed. Therefore, the probability of failure of contact between the contact points of the inspection area of the PCB stack P and the probe tips 402 is reduced, enhancing the reliability of the measurement.

While illustrative embodiments have been shown and described, it will be understood by those skilled in the art that various changes and modifications may be made without departing from the scope of the present teachings, as indicated by the following claims. These and other variations would become clear to one of ordinary skill in the art after inspection of the specification, drawings and claims herein.

The invention therefore is not to be restricted except within the spirit and scope of the appended claims.

What is claimed is:

1. A loading apparatus for loading a printed circuit board (PCB) stack comprising one or more PCB layers and transferring the PCB stack to an inspection probe for measuring thicknesses of one or more PCB layers in of the PCB stack, the loading apparatus comprising:
    a movable support unit;
    a guide unit provided on the support unit and having a depression portion for mounting the PCB stack therein; and
    a cover for covering the depression portion of the guide unit when closed, the cover having a plurality of elastic protrusions extending from a lower surface, wherein the plurality of protrusions press the PCB stack into the depression portion when the cover is closed.

2. The loading apparatus of claim 1, wherein the cover comprises:
    a perimeter part having the protrusions; and
    an opening surrounded by the perimeter part.

3. The loading apparatus of claim 1, wherein the cover is rotatably connected to the guide unit.

4. The loading apparatus of claim 1, wherein the protrusions are formed of a rubber material.

5. The loading apparatus of claim 1, wherein the protrusions are formed of a material that absorbs electromagnetic waves.

6. The loading apparatus of claim 1, wherein a depth of the depression portion is less than a sum of a thickness of the PCB stack and a length of the protrusions extending from the lower surface of the cover.

7. The loading apparatus of claim 1, further comprising:
    a control unit configured to store a position of the support unit before loading the PCB stack and a position of the inspection probe, and to control the support unit to move towards the inspection probe.

8. A printed circuit board (PCB) inspection system, comprising:
    an inspection probe for measuring thicknesses of one or more PCB layers in of a PCB stack; and
    a loading apparatus configured to load the PCB stack and to transfer the PCB stack to the inspection probe, the loading apparatus comprising:
        a movable support unit;
        a guide unit on the support unit and defining a depression portion for mounting the PCB stack therein; and
        a cover for covering the depression portion of the guide unit when closed, the cover having a plurality of elastic protrusions extending from a lower surface, wherein the plurality of protrusions press the PCB stack into the depression portion when the cover is closed.

9. The PCB inspection system of claim 8, wherein the cover comprises:
    a perimeter part having the protrusions; and
    an opening surrounded by the perimeter part.

10. The PCB inspection system of claim 8, wherein the cover is rotatably connected to the guide unit.

11. The PCB inspection system of claim 8, wherein the protrusions are formed of a rubber material.

12. The PCB inspection system of claim 8, wherein the protrusions are formed of a material that absorbs electromagnetic waves.

13. The PCB inspection system of claim 8, wherein a depth of the depression portion is less than a sum of a thickness of the PCB stack and a length of the protrusions extending from the lower surface of the cover.

14. The PCB inspection system of claim 8, further comprising
a control unit configured to store a position of the support unit before loading the PCB stack and a position of the inspection probe, and to control the support unit to move towards the inspection probe.

15. A method of measuring a thickness of a printed circuit board (PCB) stack comprising one or more PCB layers using an inspection probe and a loading apparatus comprising a movable support unit and a guide unit provided on the support unit, the method comprising:
loading the PCB stack into a depression portion of the guide unit;
closing a cover over the depression portion, causing a plurality of protrusions extending from a lower surface of the cover to press the PCB stack into the depression portion of the guide unit, securing the PCB stack in an initial position;
moving the loading apparatus to the inspection probe; and
determining a thickness of the PCB stack using the inspection probe.

16. The method of claim 15, further comprising:
before closing the cover over the depression portion, positioning the PCB stack such that one corner thereof is brought into contact with a predetermined corner of the depression portion.

17. The method of claim 15, wherein determining the thickness of the PCB stack comprises:
determining impedance of each PCB layer;
calculating the thickness of each PCB layer based on the corresponding impedance; and
determining the thickness of the PCB stack by adding the thicknesses of the PCB layers.

18. The method of claim 17, wherein determining the impedance of each PCB layer comprises:
successively contacting probe tips of the inspection probe with contact points of each PCB layer of an inspection area of the PCB stack;
measuring input and output signals of each PCB layer, and calculating corresponding S21 values based on the measured input and output signals; and
calculating the impedance of each PCB layer based on the corresponding S21 values.

19. The loading apparatus of claim 1, wherein the depression portion includes a predetermined corner for contacting the PCB stack mounted in the depression portion to provide proper alignment of the PCB stack, enabling the measuring of the thicknesses of the one or more PCB layers by the inspection probe.

20. The PCB inspection system of claim 8, wherein the depression portion in the guide unit of the loading apparatus includes a predetermined corner for contacting the PCB stack mounted in the depression portion to provide proper alignment of the PCB stack, enabling the measuring of the thicknesses of the one or more PCB layers by the inspection probe.

* * * * *